United States Patent
Murai et al.

(10) Patent No.: US 10,049,960 B2
(45) Date of Patent: Aug. 14, 2018

(54) SEMICONDUCTOR DEVICE

(71) Applicant: Mitsubishi Electric Corporation, Tokyo (JP)

(72) Inventors: Ryoji Murai, Fukuoka (JP); Shintaro Araki, Tokyo (JP); Takaaki Shirasawa, Tokyo (JP); Korehide Okamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 15/034,433

(22) PCT Filed: Jan. 6, 2014

(86) PCT No.: PCT/JP2014/050012
§ 371 (c)(1),
(2) Date: May 4, 2016

(87) PCT Pub. No.: WO2015/102046
PCT Pub. Date: Jul. 9, 2015

(65) Prior Publication Data
US 2016/0276245 A1 Sep. 22, 2016

(51) Int. Cl.
*H01L 23/373* (2006.01)
*H01L 23/24* (2006.01)
(Continued)

(52) U.S. Cl.
CPC .......... *H01L 23/3736* (2013.01); *H01L 23/24* (2013.01); *H01L 23/367* (2013.01);
(Continued)

(58) Field of Classification Search
CPC ............................ H01L 23/24; H01L 23/3736
See application file for complete search history.

(56) References Cited

U.S. PATENT DOCUMENTS 6,297,959 B1 * 10/2001 Ueno .................. H05K 1/0204
165/80.3
6,618,251 B2    9/2003 Ishimine
(Continued)

FOREIGN PATENT DOCUMENTS

| CN | 102826057 A | 12/2012 |
|---|---|---|
| JP | 05-347371 A | 12/1993 |

(Continued)

OTHER PUBLICATIONS

An Office Action; "Notice of Reasons for Rejection," issued by the Japanese Patent Office dated Apr. 25, 2017, which corresponds to Japanese Patent Application No. 2015-555853 and is related to U.S. Appl. No. 15/034,433.

(Continued)

*Primary Examiner* — Peniel M Gumedzoe
(74) *Attorney, Agent, or Firm* — Studebaker & Brackett PC

(57) ABSTRACT

According to the present invention, a grease layer having a grease as a constituent material is provided in a filling region lying between a heat dissipation surface that is a bottom surface of a heat dissipation material of a semiconductor module and a surface of a cooler. Further, a seal material is formed on the surface of the cooler and covers the entire side surface region of the grease layer without any gap. The seal material has a liquid curable sealing agent as a constituent material.

17 Claims, 8 Drawing Sheets

(51) Int. Cl.
*H01L 23/367* (2006.01)
*H01L 23/36* (2006.01)

(52) U.S. Cl.
CPC .......... *H01L 23/36* (2013.01); *H01L 23/3737* (2013.01); *H01L 2924/0002* (2013.01)

(56) References Cited

U.S. PATENT DOCUMENTS

| | | | |
|---|---|---|---|
| 7,242,582 B2 | 7/2007 | Kurauchi et al. | |
| 7,477,519 B2 | 1/2009 | Kubo | |
| 8,243,454 B2 | 8/2012 | Oota | |
| 8,558,375 B2 | 10/2013 | Mamitsu et al. | |
| 9,070,666 B2 | 6/2015 | Mamitsu et al. | |
| 9,137,926 B2 | 9/2015 | Yamaguchi et al. | |
| 2002/0070439 A1* | 6/2002 | Hiramatsu | H01L 23/24 257/687 |
| 2005/0230816 A1* | 10/2005 | Kurauchi | H01L 23/3107 257/706 |
| 2010/0254093 A1 | 10/2010 | Oota et al. | |
| 2012/0001318 A1* | 1/2012 | Mamitsu | H01L 23/4334 257/713 |
| 2012/0320531 A1* | 12/2012 | Hashimoto | H05K 5/0052 361/720 |
| 2013/0003306 A1* | 1/2013 | Oota | B60R 16/0239 361/709 |

FOREIGN PATENT DOCUMENTS

| | | |
|---|---|---|
| JP | 08-288437 A | 11/1996 |
| JP | 10-189838 A | 7/1998 |
| JP | 2000-150728 A | 5/2000 |
| JP | 2000-323631 A | 11/2000 |
| JP | 2003-124663 A | 4/2003 |
| JP | 2005-310987 A | 11/2005 |
| JP | 2008-004745 A | 1/2008 |
| JP | 2008-227361 A | 9/2008 |
| JP | 2008-266449 A | 11/2008 |
| JP | 2011-023459 A | 2/2011 |
| JP | 2012-033872 A | 2/2012 |
| JP | 2012-084761 A | 4/2012 |
| JP | 2012-191002 A | 10/2012 |
| JP | 2013-012520 A | 1/2013 |
| JP | 2013-065605 A | 4/2013 |
| JP | 2013-120866 A | 6/2013 |
| JP | 2013-153089 A | 8/2013 |
| WO | 2004/093187 A1 | 10/2004 |

OTHER PUBLICATIONS

Notification of Transmittal with Translation of the International Preliminary Report on Patentability and Written Opinion of the International Searching Authority; PCT/JP2014/050012 dated Jul. 21, 2016.

International Search Report; PCT/JP2014/050012 dated Apr. 1, 2014.

A Chinese Office Action and Search Report issued by the State Intellectual Property Office dated Jan. 11, 2018, which corresponds to Chinese Patent Application No. 201480072485.3 and is related to U.S. Appl. No. 15/034,433; with English language concise explanation.

* cited by examiner

F I G . 2 2
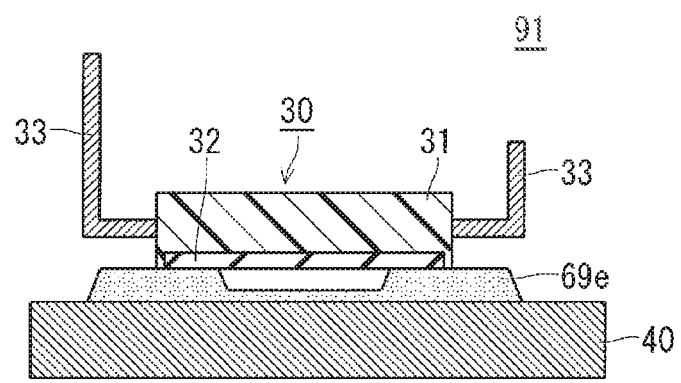

SEMICONDUCTOR DEVICE

TECHNICAL FIELD

The present invention relates to a semiconductor device having a structure including a grease member between a cooler and a semiconductor module.

BACKGROUND ART

To fill a gap between warped configurations of a semiconductor module and a cooler for the purpose of improving heat dissipation properties, a conventional semiconductor device has a structure in which a grease member is provided in a filling region between the semiconductor module such as a T-PM (Transfer mold Power Module) and the cooler and in which the semiconductor module is pressed down and fixed using a plate and the like from the opposite side of the semiconductor module from the cooler while the grease member is caused to interfere. Such a structure of the semiconductor device is disclosed, for example, in Patent Literature 1.

CITATION LIST

Patent Literature

Patent Literature 1: Japanese Patent Application Laid-Open No. 2000-323631

SUMMARY OF INVENTION

Technical Problem

Unfortunately, there has been a problem in which the thermal deformation of a junction between the semiconductor module and the cooler because of changes in temperatures of the semiconductor module itself and the environment in actual operation gives rise to grease pump-out (phenomenon) such that the grease in the grease member is forced out of the filling region between the semiconductor module and the cooler, to result in the decrease in the amount of grease in the grease member provided in the filling region. There has been another problem in which the aforementioned pump-out and an air entrainment phenomenon of the grease such that air enters the grease member result in the increase in thermal resistance of the whole product.

It is therefore an object of the present invention to solve the aforementioned problems and to provide a semiconductor device structured to prevent and suppress the pump-out of a grease member provided in a filling region between a semiconductor module and a cooler.

Solution to Problem

A semiconductor device according to a first aspect of the present invention includes: a semiconductor module having a heat dissipation surface at the bottom thereof; a cooler having a surface opposed to the heat dissipation surface; a grease member provided in a filling region lying between the heat dissipation surface of the semiconductor module and the surface of the cooler; and a tightly adherent peripheral member formed on the surface of the cooler and covering a side surface region of the grease member without any gap.

A semiconductor device according to a second aspect of the present invention includes: a semiconductor module having a heat dissipation surface at the bottom thereof; a cooler having a surface opposed to the heat dissipation surface; and first and second grease members provided in a filling region between the heat dissipation surface of the semiconductor module and the surface of the cooler, the first grease member being provided in corresponding relation to a central region of the heat dissipation surface, the second grease member being provided in corresponding relation to a peripheral region other than the central region of the heat dissipation surface, the first grease member having a semi-solid first type grease as a constituent material, the second grease member having a solidified second type grease higher in hardness than the first type grease as a constituent material.

Advantageous Effects of Invention

The semiconductor device according to the first aspect of the present invention is characterized by including the tightly adherent peripheral member formed on the surface of the cooler and covering the side surface region of the grease member without any gap.

The semiconductor device according to the first aspect having the aforementioned characteristics is capable of reliably suppressing the pump-out that is a phenomenon such that the grease constituting the grease member is forced out of the filling region lying between the heat dissipation surface of the semiconductor module and the surface of the cooler. This achieves the low thermal resistance of the whole semiconductor device to maintain the improvement in quality of the semiconductor device and to achieve the long life of the semiconductor device.

In the semiconductor device according to the second aspect of the present invention, the first grease member (having the semi-solid first type grease as a constituent material) provided in corresponding relation to the central region of the heat dissipation surface is capable of enhancing the heat dissipation properties, and the second grease member (having the solidified second type grease as a constituent material) provided in corresponding relation to the peripheral region is capable of suppressing the movement of the first type grease in the first grease member.

As a result, the semiconductor device according to the second aspect is capable of reliably suppressing the pump-out that is a phenomenon such that the first type grease is forced out of the filling region lying between the heat dissipation surface of the semiconductor module and the surface of the cooler. This achieves the low thermal resistance of the whole semiconductor device to maintain the improvement in quality of the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 22 is an illustration schematically showing the pump-out of the semiconductor device shown in FIG. 21.

DESCRIPTION OF EMBODIMENTS

<Prerequisite Technique>

Figure 21:
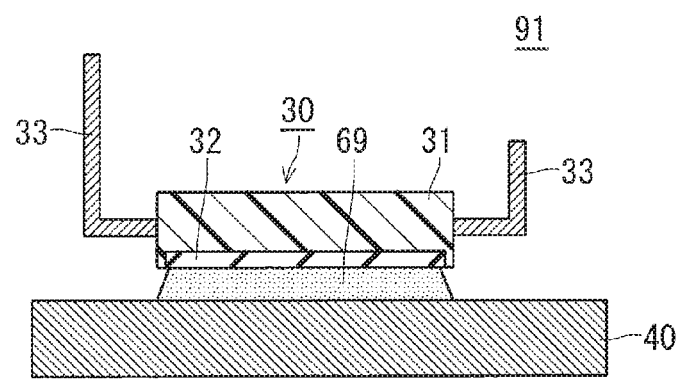
FIG. 21 is a sectional view of a structure of a semiconductor device according to a prerequisite technique.

FIG. 21 is a sectional view of a structure of a semiconductor device according to a prerequisite technique of the present invention which has a structure including a grease member between a cooler and a semiconductor module.

As shown in FIG. 21, a semiconductor device 91 according to the prerequisite technique has a structure in which a grease layer 69 (grease member) having a grease as a constituent material is provided in a filling region lying between a semiconductor module 30 and a cooler 40. The cooler 40 has a metal such as aluminum (AL) and stainless steel (SUS: Steel Special Use Stainless) as a constituent material.

The semiconductor module 30 includes a resin seal part 31 including at least one semiconductor chip (not shown) sealed in resin. A heat dissipation material 32 is formed on the major region of the bottom surface of the resin seal part 31. The heat dissipation material 32 has a metal such as aluminum, copper (Cu), a copper/molybdenum alloy (Cu/Mo), ALSiC and molybdenum as a constituent material, and is formed by processing such as etching, shot blasting, pressing and laser processing to have a thickness on the order of 10 to 50 µm.

The resin seal part 31 is formed over the upper and side surfaces of the heat dissipation material 32. Further, terminal parts 33 made of a metal and the like and having electrical conductivity are formed to extend from side surfaces of the resin seal part 31. The terminal parts 33 are electrically connected to the semiconductor chip and protrude outwardly in an L shape.

The semiconductor device 91 is constructed by providing the grease layer 69 in the filling region lying between a heat dissipation surface that is the bottom surface of the heat dissipation material 32 of the semiconductor module 30 having such a structure and a surface of the cooler 40.

The term "grease" as used herein means a "lubricant obtained by semi-solidifying a base oil with a thickening agent dispersed therein".

FIG. 22 is an illustration schematically showing the pump-out of the semiconductor device 91 shown in FIG. 21. As shown in FIG. 22, there has been a problem in which the thermal deformation effect of the semiconductor module 30 or the cooler 40 because of changes in temperatures of the semiconductor module 30 itself and the environment in actual operation gives rise to grease pump-out such that, like a grease layer 69e shown in FIG. 22, part of the grease is forced out of the filling region lying between the semiconductor module 30 and the cooler 40.

A semiconductor device having a structure including a grease layer (grease member) in a filling region lying between a cooler and a semiconductor module for the purpose of solving this problem is each semiconductor device in first to seventeenth embodiments to be described below.

First Embodiment

Figure 1:
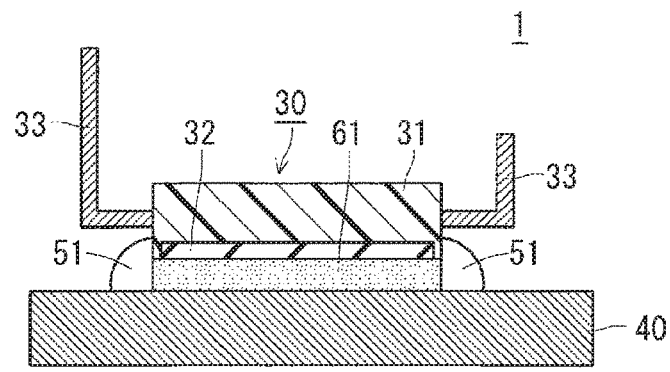
FIG. 1 is a sectional view of a structure of a semiconductor device according to a first embodiment of the present invention.

FIG. 1 is a sectional view of a structure of a semiconductor device according to a first embodiment of the present invention which has a structure including a grease layer in a filling region lying between a cooler and a semiconductor module.

As shown in FIG. 1, a semiconductor device 1 according to the first embodiment has a structure in which a grease layer 61 (grease member) is provided in the filling region lying between the semiconductor module 30 and the cooler 40.

The semiconductor module 30 includes the resin seal part 31 including at least one semiconductor chip (not shown) sealed in resin, and the heat dissipation material 32 formed on the major region of the bottom surface of the resin seal part 31. The resin seal part 31 is formed over the upper and side surfaces of the heat dissipation material 32. The semiconductor module 30 further includes the terminal parts 33 each made of a metal and the like and having electrical conductivity are formed to extend from side surfaces of the resin seal part 31. The terminal parts 33 are electrically connected to the semiconductor chip and protrude outwardly in an L shape.

The grease layer 61 having a grease as a constituent material is provided in the filling region lying between the heat dissipation surface that is the bottom surface of the heat dissipation material 32 of the semiconductor module 30 having such a structure and a surface of the cooler 40. The semiconductor module 30, the grease layer 61 and the cooler 40 are fixed together with stability because a vertical force sandwiching the grease layer 61 therebetween is applied thereto by fastening with bolts not shown.

The semiconductor device 1 according to the first embodiment further includes a seal material 51 that is a tightly adherent peripheral member formed on the surface of the cooler 40 and covering the peripheries of the heat dissipation surface of the heat dissipation material 32 and the grease layer 61 without any gap as seen in plan view, that is, covering the entire side surface region of the grease layer 61 without any gap. A liquid curable sealing agent is used as a constituent material of the seal material 51.

The term "liquid curable sealing agent" as used herein means a sealing agent satisfying the following conditions (1) and (2).

(1) The sealing agent is initially in a liquid state, and is cured by heat, moisture or a chemical reaction.

(2) After being cured, the sealing agent has adhesiveness and is higher in hardness than the "grease".

In this manner, the semiconductor device 1 according to the first embodiment is characterized by the structure in which the grease layer 61 having the grease for heat dissipation as a constituent material is provided in the filling region lying between the heat dissipation surface of the semiconductor module 30 and the surface of the cooler 40, and in which the outer periphery of the filling region is hermetically sealed with the seal material 51 composed of the liquid curable sealing agent.

The seal material 51 hermetically seals the grease layer 61 provided in the filling region lying between the semiconductor module 30 and the cooler 40 from the outside to achieve the structure preventing the pump-out of the grease layer 61 to the outside if thermal deformation occurs in and near the filling region that is a junction between the semiconductor module 30 and the cooler 40 due to the thermal deformation of the semiconductor module 30 and the cooler 40.

The liquid curable sealing agent used as the seal material 51 has stickiness, and is cured while adhering to the semiconductor module 30 and the cooler 40 to suppress the pump-out without the entry of part of the sealing agent constituting the seal material 51 into the grease layer 61 between the semiconductor module 30 and the cooler 40. This maintains a high degree of heat dissipation properties of the semiconductor device 1.

Also, the constituent material of the seal material 51 is the liquid curable sealing agent. Thus, the seal material 51 is capable of covering the entire side surface region of the grease layer 61 without any gap to provide an accurate seal without being limited by the shape and size of the heat dissipation surface of the semiconductor module 30, the thickness of the grease layer 61 and the like.

For example, the vertical force sandwiching the grease layer 61 therebetween is applied to the grease layer 61 by fastening with bolts fixing the semiconductor module 30 and the cooler 40 together, so that the thickness of the grease layer 61 is decreased to approximately the filler diameter of the grease that is the constituent material of the grease layer 61. Thereafter, the seal material 51 having a thickness conforming to the thickness of the grease layer 61 may be formed accurately.

In this manner, the semiconductor device 1 according to the first embodiment is characterized by having the seal material 51 (tightly adherent peripheral member) formed on the surface of the cooler 40 and covering the entire side surface region that is the outer peripheral part of the grease layer 61 without any gap.

The semiconductor device 1 according to the first embodiment having the aforementioned characteristics is capable of reliably suppressing the pump-out that is a phenomenon such that the grease that is the constituent material of the grease layer 61 is forced out of the filling region lying between the heat dissipation surface of the semiconductor module 30 and the surface of the cooler 40. This achieves the low thermal resistance of the whole semiconductor device 1 to maintain the improvement in quality of the semiconductor device 1 and to achieve the long life of the semiconductor device 1.

Second Embodiment

Figure 2:
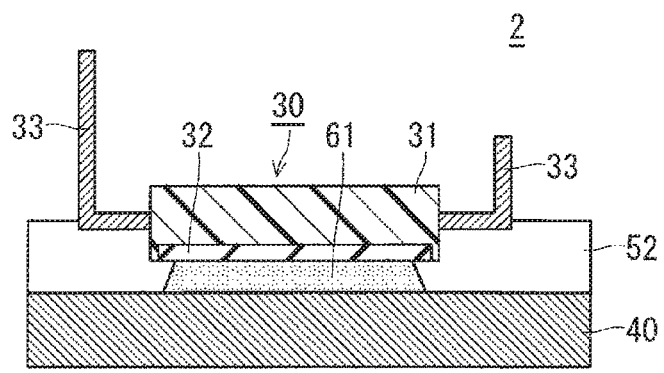
FIG. 2 is a sectional view of a structure of the semiconductor device according to a second embodiment of the present invention.

FIG. 2 is a sectional view of a structure of a semiconductor device 2 according to a second embodiment of the present invention. As shown in FIG. 2, the semiconductor device 2 according to the second embodiment is characterized in that a gel part 52 is provided in place of the seal material 51 of the first embodiment used as the tightly adherent peripheral member. Other components in FIG. 2, which are similar to those in the first embodiment shown in FIG. 1, are hence designated by the same reference numerals and characters, and will not be described as appropriate.

The gel part 52 has a hard gel having a penetration number of not greater than 55 (pursuant to JIS K2220 Testing Method) as a constituent material.

In this manner, the gel part 52 that is the tightly adherent peripheral member in the semiconductor device 2 according to the second embodiment employs a gel material having a penetration number of not greater than 55 as a constituent material. Thus, the pump-out of the grease in the grease layer 61 and the air entrainment of the grease are suppressed. As a result, this achieves the low thermal resistance of the whole semiconductor device 2 to maintain the improvement in quality of the semiconductor device 2 and to achieve the long life of the semiconductor device 2.

Third Embodiment

First Form

Figure 3:
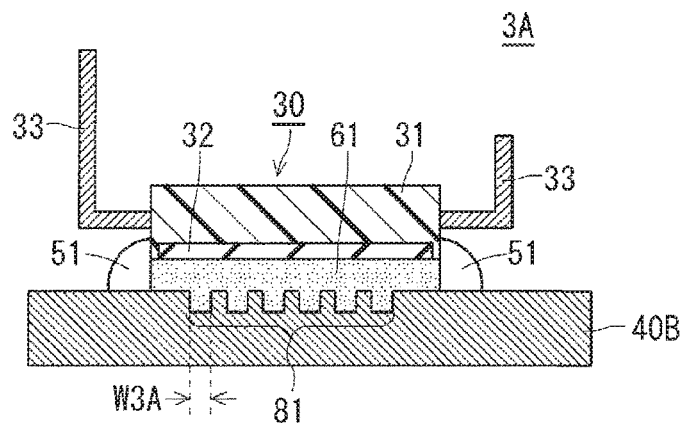
FIG. 3 is a sectional view of a structure of the semiconductor device according to a first form of a third embodiment of the present invention.

FIG. 3 is a sectional view of a structure of a semiconductor device 3A according to a first form of a third embodiment of the present invention. As shown in FIG. 3, the semiconductor device 3A according to the third embodiment is characterized in that a cooler 40B is provided in place of the cooler 40 of the first embodiment. Other components in FIG. 3, which are similar to those in the first embodiment shown in FIG. 1, are hence designated by the same reference numerals and characters, and will not be described as appropriate.

The cooler 40B according to the first form of the third embodiment is characterized by having a surface including an uneven region 81 (cooler-specific uneven region). Specifically, the uneven region 81 is formed by providing fine strip-shaped grooves in the surface of the cooler 40B. Each recess of the uneven region 81 formed in the cooler 40B has a unit recess width W3A.

In the semiconductor device 3A according to the first form of the third embodiment, the rough surface of the uneven region 81 formed in the surface of the cooler 40B and having the unit recess width W3A in this manner suppresses the movement of the grease in the grease layer 61. This may be combined with the hermetically sealing effect of the seal material 51 having the liquid curable sealing agent as a constituent material to achieve a structure further preventing the pump-out.

Second Form

Figure 4:
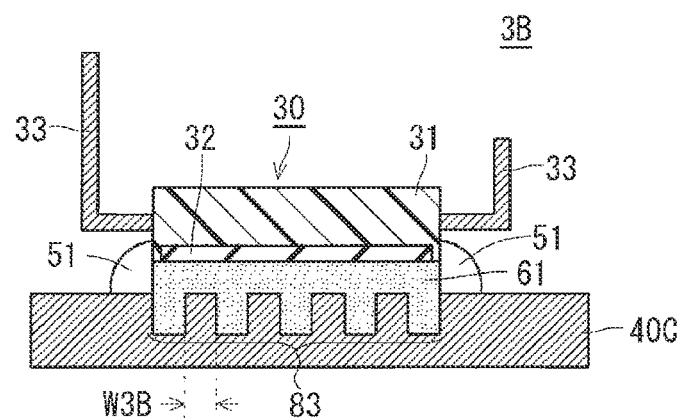
FIG. 4 is a sectional view of a structure of the semiconductor device according to a second form of the third embodiment of the present invention.

FIG. 4 is a sectional view of a structure of a semiconductor device 3B according to a second form of the third embodiment of the present invention. As shown in FIG. 4, the semiconductor device 3B according to the third embodiment includes a cooler 40C in place of the cooler 40 of the first embodiment. Other components in FIG. 4, which are similar to those in the first embodiment shown in FIG. 1, are hence designated by the same reference numerals and characters, and will not be described as appropriate.

Unlike the cooler 40, the cooler 40C is characterized by having a surface including an uneven region 83 (cooler-specific uneven region). Specifically, slit-shaped (strip-shaped) grooves are provided in the surface of the cooler 40C to form the uneven region 83. Each recess of the uneven region 83 formed in the cooler 40C has a unit recess width W3B.

The uneven region 83 formed in the cooler 40C according to the second form has the unit recess width W3B (>W3A) greater than the unit recess width W3A of the uneven region 81 formed in the cooler 40B according to the first form of the third embodiment. In this manner, the unit recess width W3B of the uneven region 83 is greater than the unit recess width W3A of the uneven region 81 because the principal purpose of the second form is to suppress a warp in the cooler 40C.

That is, the unit recess width W3A according to the first form is set to a relatively small width suitable for the suppression of the movement of the grease in the grease layer 61, whereas the unit recess width W3B according to the second form is set to a relatively great width suitable for the suppression of a warp in the cooler 40C.

In the semiconductor device 3B according to the second form of the third embodiment, the slit-shapedly grooved surface of the uneven region 83 formed in the surface of the cooler 40C and having the unit recess width W3B in this manner is capable of suppressing the deformation of the surface of the cooler 40C due to heat to prevent the grease in the grease layer 61 from being forced out of the grease layer 61. In combination with the hermetically sealing effect of the seal material 51 composed of the liquid curable sealing agent, the semiconductor device 3B according to the second form of the third embodiment achieves a structure further preventing the pump-out.

Fourth Embodiment

First Form

Figure 5:
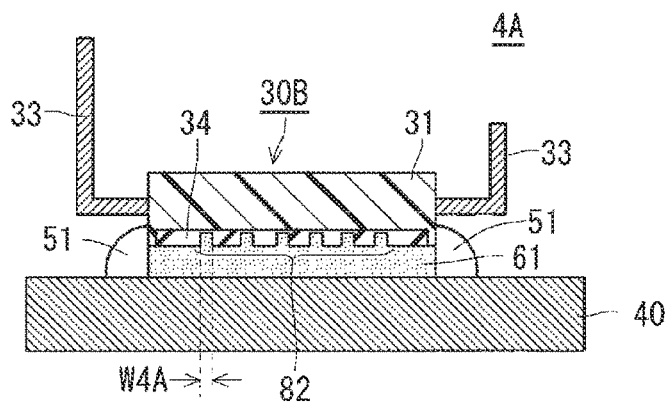
FIG. 5 is a sectional view of a structure of the semiconductor device according to a first form of a fourth embodiment of the present invention.

FIG. 5 is a sectional view of a structure of a semiconductor device 4A according to a first form of a fourth embodiment of the present invention. As shown in FIG. 5, the semiconductor device 4A according to the fourth embodiment includes a semiconductor module 30B in place of the semiconductor module 30 of the first embodiment. Other components in FIG. 5, which are similar to those in the first embodiment shown in FIG. 1, are hence designated by the same reference numerals and characters, and will not be described as appropriate.

Unlike the semiconductor module 30, the semiconductor module 30B is characterized in that a heat dissipation material 34 is provided on the bottom surface of the resin seal part 31 in place of the heat dissipation material 32 and in that the heat dissipation material 34 has a heat dissipation surface that is the bottom surface thereof including an uneven region 82 (module-specific uneven region). Specifically, the uneven region 82 is formed by providing fine strip-shaped grooves in the heat dissipation surface of the heat dissipation material 34. Each recess of the uneven region 82 formed in the heat dissipation surface of the heat dissipation material 34 has a unit recess width W4A.

In the semiconductor device 4A according to the first form of the fourth embodiment, the rough surface of the uneven region 82 formed in the heat dissipation surface of the heat dissipation material 34 and having the unit recess width W4A in this manner suppresses the movement in the filling region of the grease layer 61. This may be combined with the hermetically sealing effect of the seal material 51 composed of the liquid curable sealing agent to achieve a structure further preventing the pump-out.

Second Form

Figure 6:
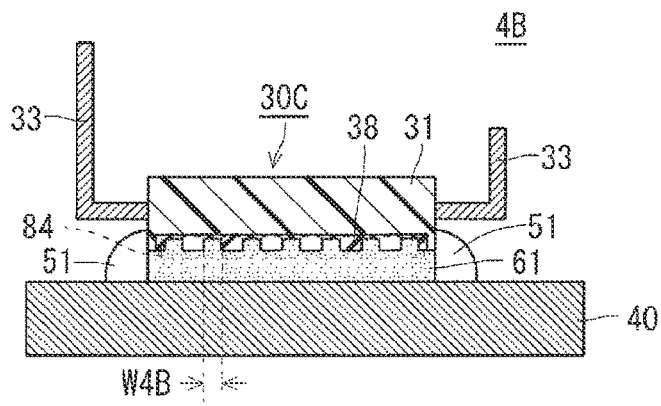
FIG. 6 is a sectional view of a structure of the semiconductor device according to a second form of the fourth embodiment of the present invention.

FIG. 6 is a sectional view of a structure of a semiconductor device 4B according to a second form of the fourth embodiment of the present invention. As shown in FIG. 6, the semiconductor device 4B according to the fourth embodiment includes a semiconductor module 30C in place of the semiconductor module 30 of the first embodiment. Other components in FIG. 6, which are similar to those in the first embodiment shown in FIG. 1, are hence designated by the same reference numerals and characters, and will not be described as appropriate.

Unlike the semiconductor module 30, the semiconductor module 30C is characterized in that a heat dissipation material 38 is provided on the bottom surface of the resin seal part 31 in place of the heat dissipation material 32 and in that the heat dissipation material 38 has a heat dissipation surface that is the bottom surface thereof including an uneven region 84 (module-specific uneven region). Specifically, the uneven region 84 is formed by providing slit-shaped (strip-shaped) grooves in the heat dissipation surface of the heat dissipation material 38. Each recess of the uneven region 84 formed in the heat dissipation surface of the heat dissipation material 38 has a unit recess width W4B.

The uneven region 84 formed in the heat dissipation surface of the heat dissipation material 38 according to the second form has the unit recess width W4B (>W4A) greater than the unit recess width W4A of the uneven region 82 formed in the heat dissipation surface of the heat dissipation material 34 according to the first form. In this manner, the unit recess width W4B of the uneven region 84 is greater than the unit recess width W4A of the uneven region 82 because the principal purpose of the second form is to suppress a warp in the heat dissipation material 38.

That is, the unit recess width W4A according to the first form is set to a relatively small width suitable for the suppression of the movement of the grease in the grease layer 61, whereas the unit recess width W4B according to the second form is set to a relatively great width suitable for the suppression of a warp in the heat dissipation material 38.

In the semiconductor device 4B according to the second form of the fourth embodiment, the slit-shapedly grooved surface of the uneven region 84 formed in the heat dissipation surface of the heat dissipation material 38 and having the unit recess width W4B in this manner is capable of suppressing the deformation of the heat dissipation surface of the semiconductor module 30C due to heat to prevent the grease in the grease layer 61 from being forced out of the grease layer 61. In combination with the hermetically sealing effect of the seal material 51 composed of the liquid curable sealing agent, the semiconductor device 4B according to the second form of the fourth embodiment achieves a structure further preventing the pump-out.

Fifth Embodiment

Figure 7:
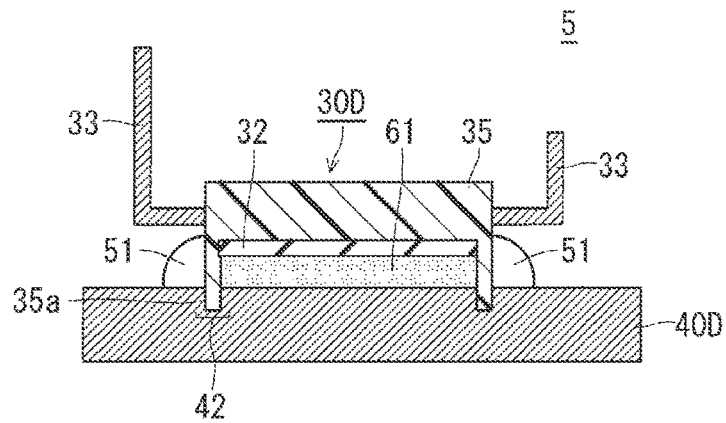
FIG. 7 is a sectional view of a structure of the semiconductor device according to a fifth embodiment of the present invention.

FIG. 7 is a sectional view of a structure of a semiconductor device 5 according to a fifth embodiment of the present invention. As shown in FIG. 7, the semiconductor device 5 according to the fifth embodiment includes a semiconductor module 30D in place of the semiconductor module 30 of the first embodiment, and a cooler 40D in place of the cooler 40.

The semiconductor module 30D includes a protrusion-equipped resin seal part 35 in place of the resin seal part 31. The protrusion-equipped resin seal part 35 is characterized by having a protrusion 35a protruding downwardly and formed along the outer periphery of the heat dissipation surface (=the filling region of the grease layer 61) that is the bottom surface of the heat dissipation material 32 as seen in plan view.

On the other hand, the cooler 40D is characterized in that a fixing groove 42 is provided in a region of the surface thereof corresponding to the protrusion 35a. As shown in FIG. 7, the semiconductor module 30D and the cooler 40D are in a positional corresponding relationship which allows the temporary fixing of the semiconductor module 30D and the cooler 40D to each other by inserting part of the protrusion 35a into the fixing groove 42 when the semiconductor module 30D and the cooler 40D are assembled. Other components in FIG. 7, which are similar to those in the first embodiment shown in FIG. 1, are hence designated by the same reference numerals and characters, and will not be described as appropriate.

In the semiconductor device 5 according to the fifth embodiment, the semiconductor module 30D and the cooler 40D are temporarily fixed to each other in this manner by inserting a tip portion that is part of the protrusion 35a of the semiconductor module 30D into the fixing groove 42. Thus, the semiconductor module 30D and the cooler 40D are brought into alignment with each other relatively easily during the manufacture.

In addition, the protrusion-equipped resin seal part 35 is formed along the outer periphery of the heat dissipation surface of the heat dissipation material 32 so as to surround the grease layer 61 as seen in plan view. The protrusion 35a of the protrusion-equipped resin seal part 35 in conjunction with the seal material 51 is capable of sealing the grease layer 61. This achieves a structure having the enhanced function of suppressing the pump-out.

Sixth Embodiment

Figure 8:
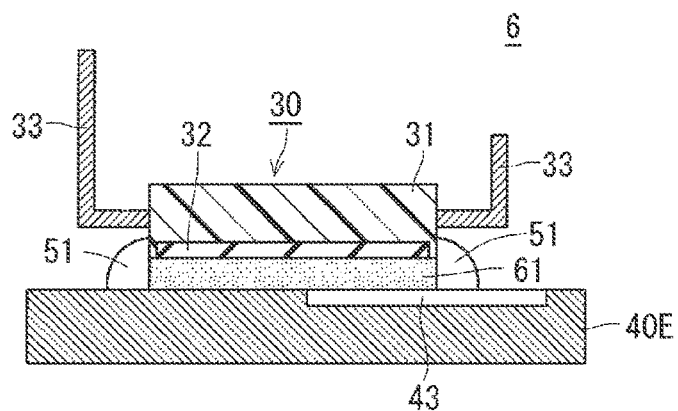
FIG. 8 is a sectional view of a structure of the semiconductor device according to a sixth embodiment of the present invention.
Figure 9:
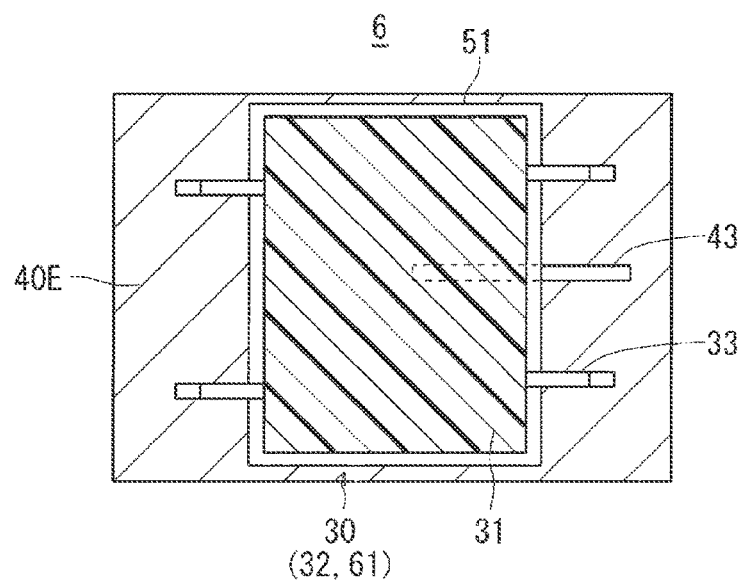
FIG. 9 is a plan view of a planar structure of the semiconductor device shown in FIG. 8.

FIG. 8 is a sectional view of a structure of a semiconductor device 6 according to a sixth embodiment of the present invention. FIG. 9 is a plan view of a planar structure of the semiconductor device 6 shown in FIG. 8. As shown in FIGS. 8 and 9, the semiconductor device 6 according to the sixth embodiment includes a cooler 40E in place of the cooler 40 of the first embodiment.

As shown in FIGS. 8 and 9, the cooler 40E is characterized by having a surface including a strip-shaped grease-specific groove 43 extending from a central region lying under the semiconductor module 30, i.e. the grease layer 61, to the outside of the semiconductor module 30 and the seal material 51 as seen in plan view.

As shown in FIG. 9, the seal material 51 covers the resin seal part 31 of the semiconductor module 30, i.e. the grease layer 61 lying under the semiconductor module 30, without any gap as seen in plan view. This characteristic is not inherent in the sixth embodiment but is common to the first to fifth embodiments described above and the seventh to fifteenth embodiments to be described later (although the seal material 51 is replaced with the gel part 52 in the second and eighth embodiments). Other components in FIGS. 8 and 9, which are similar to those in the first embodiment shown in FIG. 1, are hence designated by the same reference numerals and characters, and will not be described as appropriate.

In this manner, the cooler 40E in the semiconductor device 6 according to the sixth embodiment has the surface including the grease-specific groove 43 extending from the central region lying under the grease layer 61 to the outside of the semiconductor module 30 and the seal material 51. Such a configuration allows an extra grease to be discharged to the outside of the filling region through the grease-specific groove 43 serving as an escape route when the grease layer 61 is formed during the manufacture. This produces the effect of decreasing the thickness of the grease layer 61 to a desired thickness to decrease the thermal resistance.

Also, the sixth embodiment produces the effect of suppressing the pump-out of the grease in the grease layer 61 by forming the grease-specific groove 43 having a sufficiently small width, as in the other embodiments.

Seventh Embodiment

Figure 10:
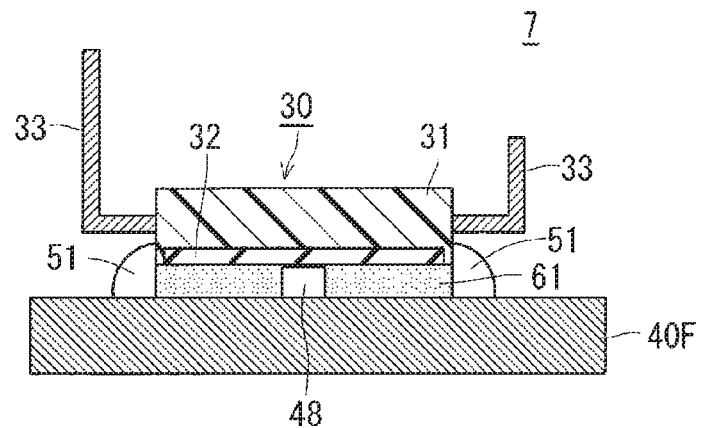
FIG. 10 is a sectional view of a structure of the semiconductor device according to a seventh embodiment of the present invention.

FIG. 10 is a sectional view of a structure of a semiconductor device 7 according to a seventh embodiment of the present invention. As shown in FIG. 10, the semiconductor device 7 according to the seventh embodiment includes a cooler 40F in place of the cooler 40 of the first embodiment.

The cooler 40F is characterized by including a bump 48 protruding upwardly from the surface thereof in corresponding relation to the central portion of the semiconductor module 30, i.e. the heat dissipation material 32, as seen in plan view. The bump 48 is joined onto the surface of the cooler 40F during or after the formation of the cooler 40F, and is hence provided integrally with the cooler 40F.

The thickness of the bump 48 provided on the surface of the cooler 40F controls the distance between the heat dissipation surface of the heat dissipation material 32 and the surface of the cooler 40F, i.e. the lower limit of the thickness of the grease layer 61. Examples of the planar shape of the bump 48 include a rectangular shape and a circular shape. Other components in FIG. 10, which are similar to those in the first embodiment shown in FIG. 1, are hence designated by the same reference numerals and characters, and will not be described as appropriate.

In the semiconductor device 7 according to the seventh embodiment, the thickness of the bump 48 provided on the surface of the cooler 40F ensures the distance (gap) having a constant value or more between the heat dissipation surface of the semiconductor module 30 and the surface of the cooler 40F. As a result, the semiconductor device 7 according to the seventh embodiment restrains part of the grease in the grease layer 61 from being forced out of the filling region due to the deformation of the cooler 40F and the semiconductor module 30 and the like. In combination with the hermetically sealing effect of the seal material 51 composed of the liquid curable sealing agent, the semiconductor device 7 according to the seventh embodiment achieves a structure less prone to the pump-out.

Further, the semiconductor device 7 according to the seventh embodiment achieves an improvement in heat dissipation properties by the use of a material having a high thermal conductivity as the bump 48.

Eighth Embodiment

Figure 11:
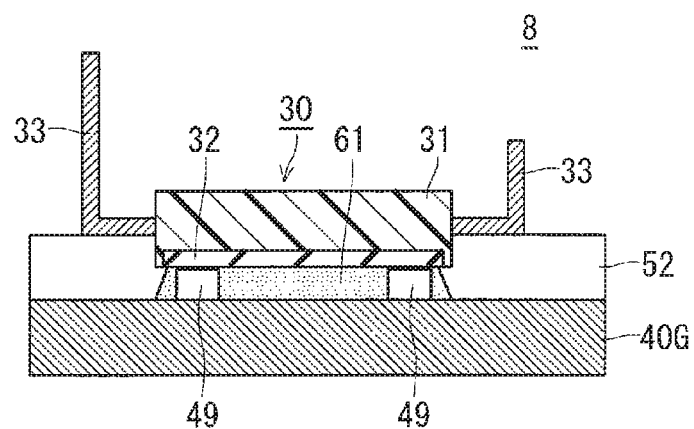
FIG. 11 is a sectional view of a structure of the semiconductor device according to an eighth embodiment of the present invention.

FIG. 11 is a sectional view of a structure of a semiconductor device 8 according to an eighth embodiment of the present invention. As shown in FIG. 11, the semiconductor device 8 according to the eighth embodiment includes the gel part 52 as in the second embodiment in place of the seal material 51 of the first embodiment used as the tightly adherent peripheral member, and a cooler 40G in place of the cooler 40 of the first embodiment.

The cooler 40G is characterized by including four bumps 49 (only two of which are shown in FIG. 11) protruding upwardly from the surface thereof in corresponding relation to the four corner portions of the semiconductor module 30, i.e. the heat dissipation material 32, as seen in plan view. The four bumps 49 are joined onto the surface of the cooler 40G during or after the formation of the cooler 40G, and are hence provided integrally with the cooler 40G.

The thickness of the four bumps 49 controls the distance between the heat dissipation surface of the heat dissipation material 32 and the surface of the cooler 40G, i.e. the lower limit of the thickness of the grease layer 61. Examples of the planar shape of the four bumps 49 include a rectangular shape and a circular shape. Other components in FIG. 11, which are similar to those in the first embodiment shown in FIG. 1, are hence designated by the same reference numerals and characters, and will not be described as appropriate.

In the semiconductor device 8 according to the eighth embodiment, the thickness of the four bumps 49 ensures the distance (gap) having a constant value or more between the heat dissipation surface of the semiconductor module 30 and the surface of the cooler 40G. As a result, the semiconductor device 8 according to the eighth embodiment restrains part of the grease in the grease layer 61 from being forced out of the filling region due to the deformation of the semiconductor module 30 and the cooler 40G and the like. In combination with the hermetically sealing effect of the gel part 52, the semiconductor device 8 according to the eighth embodiment achieves a structure less prone to the pump-out.

Further, the semiconductor device 8 according to the eighth embodiment achieves an improvement in heat dissipation properties by the use of a material having a high thermal conductivity as the four bumps 49. Also, the grease layer 61 and the semiconductor module 30 are covered in a relatively large area by the provision of the gel part 52 manufactured more easily at lower costs than the seal material 51 as the tightly adherent peripheral member.

Although the gel part 52 is used as the tightly adherent peripheral member in the eighth embodiment, the seal material 51 may be used as the tightly adherent peripheral member as in the seventh embodiment.

Ninth Embodiment

Figure 12:
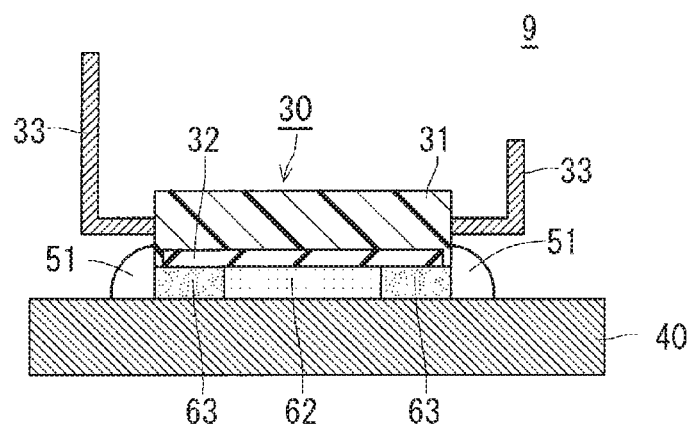
FIG. 12 is a sectional view of a structure of the semiconductor device according to a ninth embodiment of the present invention.

FIG. 12 is a sectional view of a structure of a semiconductor device 9 according to a ninth embodiment of the present invention. As shown in FIG. 12, the semiconductor device 9 according to the ninth embodiment is characterized in that grease layers 62 and 63 (first and second grease members) having respectively two different types of greases as constituent materials are provided in place of the grease layer 61. Other components in FIG. 12, which are similar to those in the first embodiment shown in FIG. 1, are hence designated by the same reference numerals and characters, and will not be described as appropriate.

The grease layer 62 has a first grease containing a small filler having a filler size FS1 (first filler size) as a constituent material, and the grease layer 63 has a second grease containing a large filler having a filler size FS2 (second filler size; FS2>FS1) as a constituent material. Examples of the filler sizes FS1 and FS2 are as follows: the filler size FS1 is a filler diameter of less than 70 μm, and the filler size FS2 is a filler diameter of greater than 70 μm.

The grease layer 62 is provided in corresponding relation to a central region of the heat dissipation surface of the heat dissipation material 32, and the grease layer 63 is provided in corresponding relation to a peripheral region other than the central region of the heat dissipation surface.

In the semiconductor device 9 according to the ninth embodiment, the first grease containing a small filler relatively responsive to an outside movement (such as deformation) is used as a constituent material of the grease layer 62 provided in corresponding relation to the central region of the heat dissipation surface. This achieves a small gap resulting from the deformation of the semiconductor module 30 and the cooler 40 due to heat generated from the semiconductor device 9 itself.

In the semiconductor device 9 according to the ninth embodiment, on the other hand, the second grease containing a large filler relatively less responsive to an outside movement (such as deformation) is used as a constituent material of the grease layer 63 provided in corresponding relation to the peripheral region. Thus, the semiconductor device 9 according to the ninth embodiment is capable of restraining not only the second grease in the grease layer 63 but also the first grease in the grease layer 62 from being forced out due to the deformation of the semiconductor module 30 and the cooler 40. In combination with the hermetically sealing effect of the seal material 51 composed of the liquid curable sealing agent, the semiconductor device 9 according to the ninth embodiment achieves a structure less prone to the pump-out.

Tenth Embodiment

Figure 13:
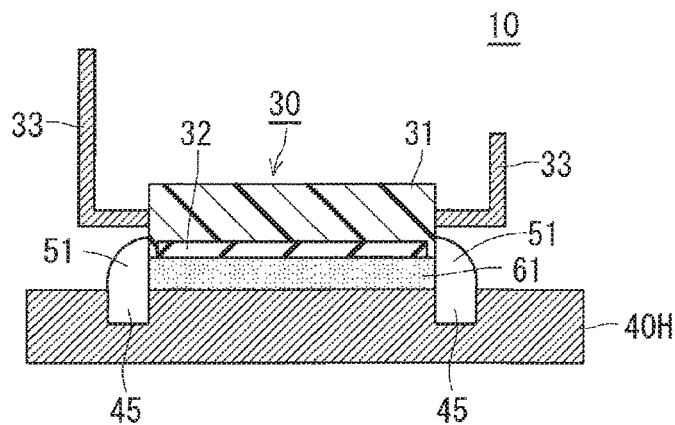
FIG. 13 is a sectional view of a structure of the semiconductor device according to a tenth embodiment of the present invention.

FIG. 13 is a sectional view of a structure of a semiconductor device 10 according to a tenth embodiment of the present invention. As shown in FIG. 13, the semiconductor device 10 according to the tenth embodiment includes a cooler 40H in place of the cooler 40 of the first embodiment. Other components in FIG. 13, which are similar to those in the first embodiment shown in FIG. 1, are hence designated by the same reference numerals and characters, and will not be described as appropriate.

Unlike the cooler 40, the cooler 40H is characterized in that a seal material-specific groove 45 is formed in a region of the surface thereof along the outer periphery of the grease layer 61, i.e. a region of the surface thereof corresponding to a region in which the seal material 51 is formed and in that part of the seal material 51 is buried in the seal material-specific groove 45. That is, the seal material-specific groove 45 in the semiconductor device 10 according to the tenth embodiment is formed in the surface of the cooler 40H along the outer periphery of the heat dissipation surface of the semiconductor module 30 as seen in plan view.

In the semiconductor device 10 according to the tenth embodiment, part of the seal material 51 that is the tightly adherent peripheral member is buried in the seal material-specific groove 45 that is a groove for the tightly adherent peripheral member in this manner. This increases the area of adhesion between the seal material 51 and the cooler 40H to further enhance the sealing effect of the seal material 51.

Eleventh Embodiment

Figure 14:
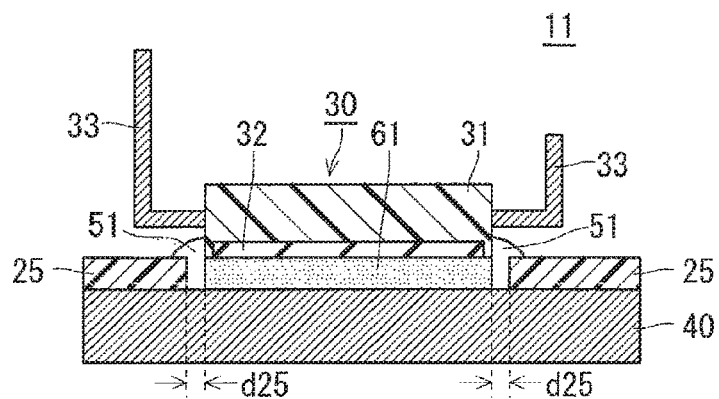
FIG. 14 is a sectional view of a structure of the semiconductor device according to an eleventh embodiment of the present invention.

FIG. 14 is a sectional view of a structure of a semiconductor device 11 according to an eleventh embodiment of the present invention. As shown in FIG. 14, a resist 25 made of resin and the like is further formed on the surface of the cooler 40. The resist 25 is formed on the surface of the cooler 40 along the outer periphery of the grease layer 61, with a distance d25 for the seal material 51 held between the resist 25 and the edge of the grease layer 61, as seen in plan view.

In this manner, the semiconductor device 11 according to the eleventh embodiment includes the resist 25 selectively provided on the surface of the cooler 40. Part of the seal material 51 is buried in a groove defined by the distance d25 between the grease layer 61 and the resist 25.

When the resist 25 provided on the cooler 40 with a high tight adhesion strength is considered as part of the cooler 40, the provision of the resist 25 in the semiconductor device 11 according to the eleventh embodiment increases the area of adhesion between the seal material 51 and the cooler 40 (plus the resist 25) to enhance the sealing effect of the seal material 51.

Heat dissipation properties are not especially required for the resist 25 because the resist 25 is provided on the outer periphery of the region corresponding to the heat dissipation material 32.

Twelfth Embodiment

Figure 15:
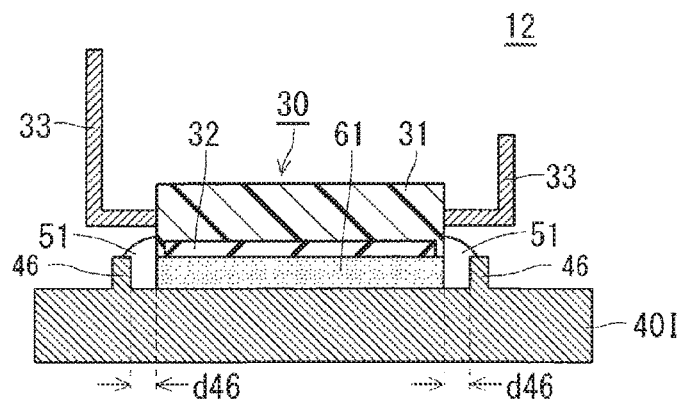
FIG. 15 is a sectional view of a structure of the semiconductor device according to a twelfth embodiment of the present invention.

FIG. 15 is a sectional view of a structure of a semiconductor device 12 according to a twelfth embodiment of the present invention. As shown in FIG. 15, the semiconductor device 12 according to the twelfth embodiment includes a cooler 40I in place of the cooler 40 of the first embodiment. Other components in FIG. 15, which are similar to those in the first embodiment shown in FIG. 1, are hence designated by the same reference numerals and characters, and will not be described as appropriate.

Unlike the cooler 40, the cooler 40I further includes a protrusion 46 formed on the surface thereof. The protrusion 46 protrudes upwardly from the surface of the cooler 40I and formed along the outer periphery of the grease layer 61, with a distance d46 for the seal material 51 held between the protrusion 46 and the edge of the grease layer 61.

In this manner, the semiconductor device 12 according to the twelfth embodiment includes the protrusion 46 provided on the surface of the cooler 40I. Part of the seal material 51 is buried in a groove defined by the distance d46 between the grease layer 61 and the protrusion 46.

Thus, the presence of the protrusion 46 as part of the cooler 40I in the semiconductor device 12 according to the twelfth embodiment increases the area of adhesion between the seal material 51 and the cooler 40I to enhance the sealing effect of the seal material 51.

Thirteenth Embodiment

Figure 16:
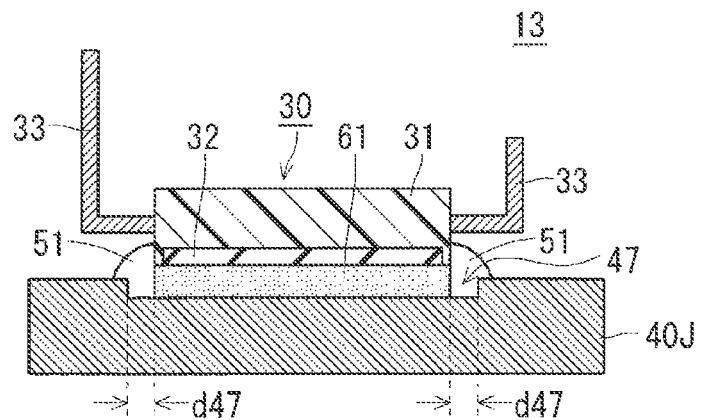
FIG. 16 is a sectional view of a structure of the semiconductor device according to a thirteenth embodiment of the present invention.

FIG. 16 is a sectional view of a structure of a semiconductor device 13 according to a thirteenth embodiment of the present invention. As shown in FIG. 16, the semiconductor device 13 according to the thirteenth embodiment includes a cooler 40J in place of the cooler 40 of the first embodiment. Other components in FIG. 16, which are similar to those in the first embodiment shown in FIG. 1, are hence designated by the same reference numerals and characters, and will not be described as appropriate.

Unlike the cooler 40, the cooler 40J further includes a recess 47 in the surface thereof. In the thirteenth embodiment, the filling region of the grease layer 61 is a region lying between the bottom surface of the recess 47 and the heat dissipation surface of the semiconductor module 30. The recess 47 is formed, with a distance d47 for the seal material 51 held from the edge of the side surface of the grease layer 61.

In this manner, the cooler 40J in the semiconductor device 13 according to the thirteenth embodiment includes the recess 47 depressed from the surface thereof and formed in a region including the whole of the semiconductor module 30 and part of the seal material 51 as seen in plan view. Part of the seal material 51 is buried in a gap region defined by the distance d47 between the edge of the side surface of the grease layer 61 and the side surface of the recess 47. The provision of the recess 47 in the cooler 40J in the semiconductor device 13 according to the thirteenth embodiment increases the area of adhesion between the seal material 51 and the cooler 40J to enhance the sealing effect of the seal material 51.

Fourteenth Embodiment

Figure 17:
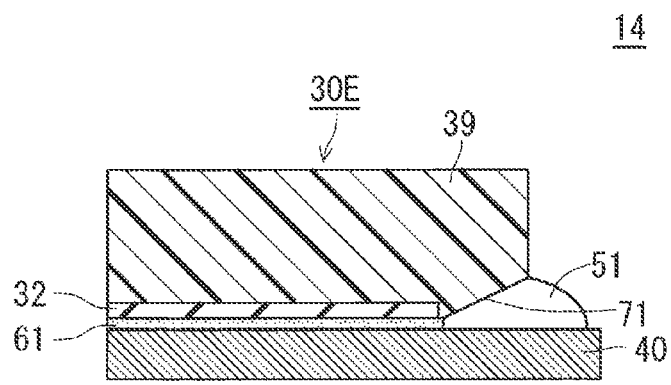
FIG. 17 is a sectional view of part of a structure of the semiconductor device according to a fourteenth embodiment of the present invention.

FIG. 17 is a sectional view of part of a structure of a semiconductor device 14 according to a fourteenth embodiment of the present invention. As shown in FIG. 17, the semiconductor device 14 according to the fourteenth embodiment includes a semiconductor module 30E in place of the semiconductor module 30 of the first embodiment.

Unlike the semiconductor module 30, the semiconductor module 30E includes a beveled resin seal part 39 in place of the resin seal part 31. Each of the four sides constituting the periphery of the bottom surface of the beveled resin seal part 39 has a bevel 71 obtained by beveling.

The bevel 71 is formed by beveling upwardly in a direction toward the edge of the side surface of the resin seal part 39, i.e. by beveling so that a distance from the surface of the cooler 40 increases in the direction of the edge of the side surface (rightwardly as viewed in FIG. 17).

The heat dissipation material 32 is provided on the bottom surface of the beveled resin seal part 39 except the bevel 71, and the grease layer 61 is provided in the filling region lying between the heat dissipation surface of the heat dissipation material 32 and the surface of the cooler 40. Other components in FIG. 17, which are similar to those in the first embodiment shown in FIG. 1, are hence designated by the same reference numerals and characters, and will not be described as appropriate.

The semiconductor module 30E in the semiconductor device 14 according to the fourteenth embodiment includes the bevel 71, so that the space becoming wider toward the edge is formed under the bevel 71 of the beveled resin seal part 39. Thus, the liquid curable sealing agent which is the constituent material of the seal material 51 and which is initially in a liquid state is liable to flow outwardly (with respect to the semiconductor module 30) during the manufacture. The possibility that the liquid curable sealing agent enters the grease layer 61 is accordingly suppressed, so that the heat dissipation properties of the grease layer 61 are maintained.

In addition, the area of adhesion between the seal material 51 and the semiconductor module 30E is increased by the provision of the bevel 71 in the semiconductor module 30E. This enhances the sealing effect of the seal material 51.

Fifteenth Embodiment

Figure 18:
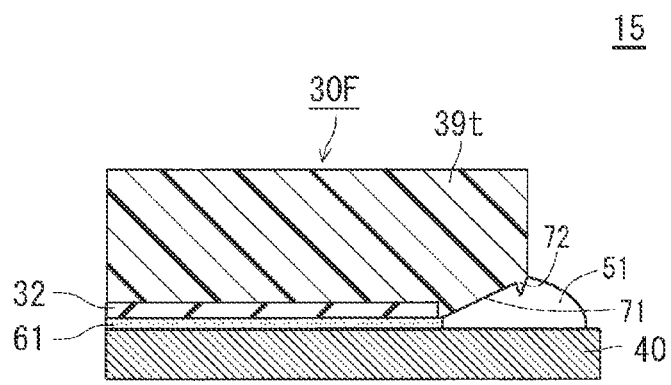
FIG. 18 is a sectional view of part of a structure of the semiconductor device according to a fifteenth embodiment of the present invention.

FIG. 18 is a sectional view of part of a structure of a semiconductor device 15 according to a fifteenth embodiment of the present invention. As shown in FIG. 18, the semiconductor device 15 according to the fifteenth embodiment includes a semiconductor module 30F in place of the semiconductor module 30E of the fourteenth embodiment.

Unlike the semiconductor module 30E, the semiconductor module 30F includes a beveled resin seal part 39t in place of the beveled resin seal part 39. The beveled resin seal part 39t includes the bevel 71 similar to that of the beveled resin seal part 39, and further includes a protrusion 72 having a tapering protrusion tip and protruding downwardly along the edge of each of the four sides of the bottom surface where the bevel 71 is formed. Other components in FIG. 18, which are similar to those in the fourteenth embodiment shown in FIG. 17, are hence designated by the same reference numerals and characters, and will not be described as appropriate.

The beveled resin seal part 39t in the semiconductor device 15 according to the fifteenth embodiment includes the protrusion 72 in addition to the bevel 71.

The seal material 51 having the liquid curable sealing agent as a constituent material has the advantage that the curing thereof starts from a surface in contact with air to form a film at the surface thereof. During the manufacture of the seal material 51, the film at the surface is broken as appropriate by the sharp tip of the protrusion 72 formed in the beveled resin seal part 39t, so that an uncured inside sealing agent flows outwardly. This produces the effect of suppressing the entry of the sealing agent into the grease layer 61 to maintain the heat dissipation properties of the grease layer 61.

In addition, the provision of the bevel 71 as in the fourteenth embodiment maintains the heat dissipation properties of the filling region of the grease layer 61 and enhances the sealing effect of the seal material 51.

Sixteenth Embodiment

Figure 19:
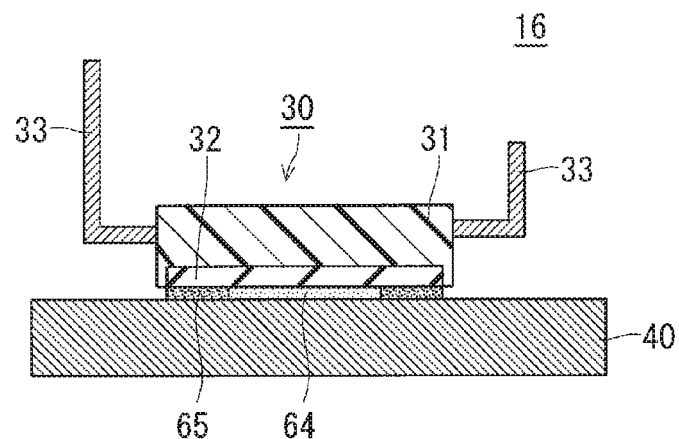
FIG. 19 is a sectional view of a structure of the semiconductor device according to a sixteenth embodiment of the present invention.

FIG. 19 is a sectional view of a structure of a semiconductor device 16 according to a sixteenth embodiment of the present invention. As shown in FIG. 19, the semiconductor device 16 according to the sixteenth embodiment has a structure in which grease layers 64 and 65 (first and second grease members) having respectively two different types of greases as constituent materials are provided between the semiconductor module 30 and the cooler 40. Specifically, the grease layers 64 and 65 are provided in the filling region lying between the heat dissipation surface that is the bottom surface of the heat dissipation material 32 of the semiconductor module 30 and the surface of the cooler 40. Other components in FIG. 19, which are similar to those in the first embodiment shown in FIG. 1, are hence designated by the same reference numerals and characters, and will not be described as appropriate.

The grease layer 64 is provided in corresponding relation to a central region of the aforementioned heat dissipation surface, and the grease layer 65 is provided in corresponding relation to a peripheral region other than the central region of the aforementioned heat dissipation surface.

The constituent material of the grease layer 64, which is similar to that of the grease layer 61, is a grease (first type grease) remaining semi-solid after the completion of the device. On the other hand, a two-liquid curable grease (second type grease) is used as the constituent material of the grease layer 65. The two-liquid curable grease is solidified after the completion of the device because of its property of being solidified when cured by a chemical reaction of the two liquids. The term "semi-solid" means having a viscosity of not greater than 600 [Pa·s].

In this manner, the semiconductor device 16 according to the sixteenth embodiment is characterized in that the grease layers 64 and 65 having respectively the two different types of greases (first and second type greases) as constituent materials are provided between the semiconductor module 30 and the cooler 40.

In the semiconductor device 16 having the aforementioned characteristics, the first type grease of the grease layer 64 (first grease member) provided in corresponding relation to the central region of the heat dissipation surface of the semiconductor module 30 is capable of enhancing the heat dissipation properties, and the second type grease of the grease layer 65 (second grease member) provided in corresponding relation to the peripheral region is capable of suppressing the movement of the grease in the grease layer 64. That is, the grease layer 64 has the function of the grease layer 61 (62 and 63) used in the first to fifteenth embodiments, and the grease layer 65 has the function of the tightly adherent peripheral member (seal material 51 and the gel part 52) used in the first to fifteenth embodiments.

In general, the two-liquid curable grease has the property of being lower in stickiness and in hardness after being cured than the liquid curable sealing agent that is the constituent material of the seal material 51. However, the cooler 40 and the semiconductor module 30 compress the grease layer 65 having the two-liquid curable grease as the constituent material as shown in FIG. 19, so that the sealing function is enhanced.

Thus, the semiconductor device 16 according to the sixteenth embodiment is capable of reliably suppressing the pump-out which is a phenomenon such that the first type grease in the grease layer 64 is forced out of the filling region lying between the heat dissipation surface of the semiconductor module 30 and the surface of the cooler. This achieves the low thermal resistance of the whole semiconductor device to maintain the improvement in quality of the semiconductor device and to achieve the long life of the semiconductor device.

Further, the second type grease that is the constituent material of the grease layer 65, which is the two-liquid curable grease, is cured to the inside thereof not in contact with air to achieve a stable sealing effect. The pump-out of the grease layer 64 is suppressed without the need for sealing members other than the grease layers 64 and 65.

Further, the two-liquid curable grease has a thermal conductivity higher than that of the sealing agent such as the liquid curable sealing agent to suppress the decrease in heat dissipation properties. In addition, the grease layer 65 is formed only in the peripheral region of the heat dissipation surface. Thus, only a minimum amount of second type grease is required to achieve the semiconductor device 16 having the aforementioned effects.

Seventeenth Embodiment

Figure 20:
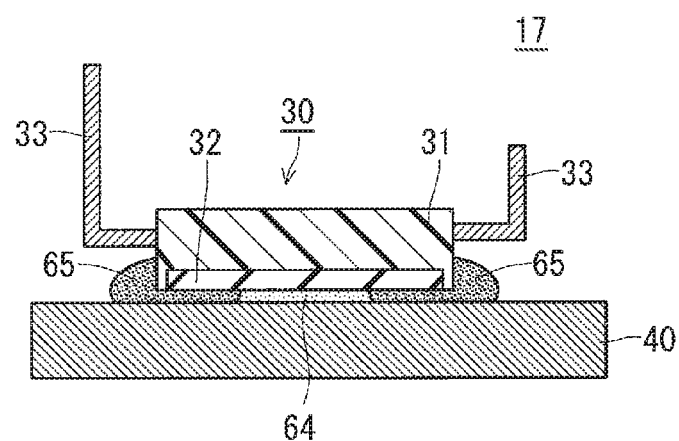
FIG. 20 is a sectional view of a structure of the semiconductor device according to a seventeenth embodiment of the present invention.

FIG. 20 is a sectional view of a structure of a semiconductor device 17 according to a seventeenth embodiment of the present invention. As shown in FIG. 20, the semiconductor device 17 according to the seventeenth embodiment has a structure in which the two different types of grease layers 64 and 65 (first and second grease members) are provided between the semiconductor module 30 and the cooler 40 as in the sixteenth embodiment. Other components in FIG. 20, which are similar to those in the first and sixteenth embodiments shown in FIGS. 1 and 19, are hence designated by the same reference numerals and characters, and will not be described as appropriate.

The grease layer 64 is provided in corresponding relation to the central region of the aforementioned heat dissipation surface, and the grease layer 65 is provided over the peripheral region other than the central region of the aforementioned heat dissipation surface and part of the surface of the cooler 40 outside the peripheral region.

In this manner, the semiconductor device 17 according to the seventeenth embodiment is characterized in that the grease layers 64 and 65 having respectively the two different types of greases (first and second type greases) as constituent materials are provided between the semiconductor module 30 and the cooler 40 as in the sixteenth embodiment.

In the semiconductor device 17 having the aforementioned characteristics, the grease layer 64 provided in corresponding relation to the central region of the heat dissipation surface of the semiconductor module 30 is capable of enhancing the heat dissipation properties, and the grease layer 65 provided in corresponding relation to the peripheral region and part of the surface of the cooler 40 outside the peripheral region is capable of suppressing the movement of the grease layer 64, as in the sixteenth embodiment.

Further, the second type grease that is the constituent material of the grease layer 65, which is the two-liquid curable grease, is capable of suppressing the pump-out and the decrease in heat dissipation properties, as in the sixteenth embodiment.

In addition, the grease layer 65 extends from the peripheral region of the heat dissipation surface to part of the surface of the cooler 40 outside the peripheral region. This increases the area of adhesion between the grease layer 65 and the cooler 40 to enhance the sealing effect of the grease layer 65.

<Method of Manufacturing Semiconductor Device>

A method of manufacturing a semiconductor device according to the present invention will be described using the semiconductor device 1 of the first embodiment shown in FIG. 1 as an example.

The method of manufacturing the semiconductor device is achieved essentially by executing the following steps (a) to (d):

(a) the step of preparing the semiconductor module 30 including the resin seal part 31, the heat dissipation material 32 and the terminal parts 33, and the cooler 40;

(b) the step of applying the grease layer 61 to the heat dissipation surface of the heat dissipation material 32 by printing;

(c) the step of forming a liquid curable sealing agent so as to cover the entire side surface region of the grease layer 61 to provide the seal material 51; and (d) fixing the semiconductor module 30 and the cooler 40 to each other by fastening with bolts and the like, thereby finishing the semiconductor device 1.

In the step (a), processing for providing the semiconductor modules 30B to 39F and the coolers 40B to 40J described in the third to eighth embodiments, the tenth embodiment, and the twelfth to fifteenth embodiments is performed in addition.

In the step (b), the grease layers 62 and 63 are formed in place of the grease layer 61 in the ninth embodiment, and the grease layers 64 and 65 are formed in place of the grease layer 61 in the sixteenth and the seventeenth embodiments. The execution of the step (c) is dispensed with in the sixteenth and seventeenth embodiments.

In the case of the application of the grease layers 62 and 63 in the step (b), the grease layer 62 is applied to the central region of the heat dissipation surface of the heat dissipation material 32 by printing, and the grease layer 63 is applied to the peripheral region thereof by printing.

In the case of the application of the grease layers 64 and 65 in the step (b), the grease layer 64 is applied to the central region of the heat dissipation surface of the heat dissipation material 32 by printing, and the grease layer 65 is applied to the peripheral region thereof by printing. The grease layer 65 may be applied to the surface of the cooler 40 (including the region corresponding to the aforementioned peripheral region).

In the step (c), the gel part 52 is formed in place of the seal material 51 in the second and eighth embodiments.

In the step (c), the process of forming the resist 25 is additionally executed in the eleventh embodiment.

For the manufacture of the semiconductor device 10 of the tenth embodiment, for example, a grease having a viscosity on the order of 300 to 600 [Pa·s] is used as the constituent material of the grease layer 61, so that the seal material-specific groove 45 formed in the surface of the cooler 40H is not filled with the grease layer 61 during the execution of the aforementioned steps (c) and (d).

<Modifications>

The heat dissipation materials 34 and 38 shown in the first to seventeenth embodiments are different in shape but are similar in constituent material to the heat dissipation material 32. The shapes of the respective heat dissipation materials 34 and 38 are achievable by already existing methods.

The coolers 40B to 40I are different in shape but are similar in constituent material to the cooler 40. The shapes of the respective coolers 40B to 40I are achievable by already existing methods. The shapes of the resin seal parts 35, 39, 39t and the like are achievable by already existing methods with varied metal molds.

The embodiments according to the present invention may be freely combined within the scope of the invention or the embodiments may be changed and dispensed with, as appropriate.

For example, the configurations including the seal material 51 or the gel part 52 used as the tightly adherent peripheral member are shown in the first to seventeenth embodiments, but may be replaced as appropriate.

While the invention has been described in detail, the foregoing description is in all aspects illustrative and not restrictive. It is understood that numerous other modifications and variations not illustrated can be devised without departing from the scope of the invention.

The invention claimed is:

1. A semiconductor device comprising:
a semiconductor module having a resin seal part including at least one semiconductor chip sealed in resin and a heat dissipation surface at a bottom of said resin seal part;
a cooler having a surface opposed to said heat dissipation surface;
a grease member provided in direct contact with said heat dissipation surface of said semiconductor module and the surface of said cooler; and
a tightly adherent peripheral member formed on the surface of said cooler, completely covering at least a side surface of said grease member without any gap, and extending above a top surface of said heat dissipation material, wherein
said tightly adherent peripheral member includes a gel material having a penetration number of not greater than 55 as a constituent material.

2. The semiconductor device according to claim 1, wherein
said cooler includes a cooler-specific uneven region in the surface thereof.

3. The semiconductor device according to claim 1, wherein
said semiconductor module includes a module-specific uneven region in said heat dissipation surface thereof.

4. The semiconductor device according to claim 1, wherein:
said semiconductor module includes a protrusion protruding from part of said heat dissipation surface,
said cooler includes a fixing groove in the surface thereof, and
said protrusion of said semiconductor module and said fixing groove of said cooler are formed in corresponding relationship such that part of said protrusion is inserted in said fixing groove.

5. The semiconductor device according to claim 4, wherein
said protrusion is formed along an outer periphery of said heat dissipation surface so as to surround said grease member as seen in plan view.

6. The semiconductor device according to claim 1, wherein:
said cooler includes a grease-specific groove in the surface thereof, and
said grease-specific groove has a portion overlapping a region in which said grease member is formed, and another portion extending to the outside of the region in which said grease member is formed as seen in plan view.

7. The semiconductor device according to claim 1, wherein
said cooler includes a bump protruding upwardly from the surface thereof and formed in a region corresponding to a central portion of said heat dissipation surface as seen in plan view.

8. The semiconductor device according to claim 1, wherein
said cooler includes a plurality of bumps protruding upwardly from the surface thereof and formed in respective regions corresponding to four corner portions of said heat dissipation surface as seen in plan view.

9. The semiconductor device according to claim 1, wherein:
said grease member includes
a first grease member having a first grease having a first filler size as a constituent material, and
a second grease member having a second grease having a second filler size greater than said first filler size as a constituent material, and
said first grease is provided in corresponding relation to a central region of said heat dissipation surface, and said second grease is provided in corresponding relation to a peripheral region other than said central region of said heat dissipation surface.

10. The semiconductor device according to claim 1, wherein:
said cooler includes a groove for said tightly adherent peripheral member in the surface thereof, said groove for said tightly adherent peripheral member being formed along an outer periphery of said heat dissipation surface of said semiconductor module as seen in plan view, and
part of said tightly adherent peripheral member is buried in said groove for said tightly adherent peripheral member.

11. The semiconductor device according to claim 1, further comprising a resist formed on the surface of said cooler along an outer periphery of said tightly adherent peripheral member as seen in plan view.

12. The semiconductor device according to claim 1, wherein:
said cooler includes a protrusion protruding from the surface thereof and formed along an outer periphery of said semiconductor module as seen in plan view, and
said tightly adherent peripheral member extends from a periphery of said grease member to said protrusion.

13. The semiconductor device according to claim 1, wherein:
said cooler includes a recess in the surface thereof, said recess being depressed from the surface thereof and formed in a region including at least a portion of said semiconductor module and at least part of said tightly adherent peripheral member as seen in plan view,
said grease member is provided so that a region lying between said heat dissipation surface and a bottom surface of said recess of said cooler is used as said filling region thereof, and
at least part of said tightly adherent peripheral member is buried in said recess except said filling region.

14. A semiconductor device comprising:
a semiconductor module having a heat dissipation material disposed to form a heat dissipation surface at a bottom thereof;
a cooler having a surface opposed to said heat dissipation surface;
a grease member provided in direct contact with said heat dissipation surface of said semiconductor module and the surface of said cooler; and
a tightly adherent peripheral member formed on the surface of said cooler, completely covering at least a side surface of said grease member without any gap, and extending above a top surface of said heat dissipation material, wherein
said tightly adherent peripheral member includes a liquid curable sealing agent that, after curing, has a hardness higher than that of said grease member,
said semiconductor module has a peripheral portion including a bevel so that a distance from the surface of said cooler increases in the direction of the edge thereof, said heat dissipation surface is provided at the bottom of said semiconductor module except said bevel, at least part of said tightly adherent peripheral member is formed under said bevel, and the edge of said semiconductor module further includes a protrusion protruding downwardly.

15. A semiconductor device comprising:

a semiconductor module having a metal heat dissipation material disposed to form a heat dissipation surface at a bottom thereof;

a cooler having a surface opposed to said heat dissipation surface; and first and second grease members provided in a filling region between said heat dissipation surface of said semiconductor module and the surface of said cooler, said first grease member being in direct contact with said metal heat dissipation material and being provided in corresponding relation to a central region of said heat dissipation surface, said second grease member being provided in direct contact with said metal heat dissipation material and in corresponding relation to the whole of a peripheral region other than said central region of said heat dissipation surface, said first grease member having a semi-solid first type grease as a constituent material, and said second grease member having a solidified second type grease higher in hardness than said first type grease as a constituent material.

16. The semiconductor device according to claim 15, wherein:

said second type grease is a two-liquid curable grease, and said second grease member is formed only in said peripheral region of said heat dissipation surface.

17. The semiconductor device according to claim 15, wherein:

said second type grease is a two-liquid curable grease, and said second grease member extends from said peripheral region of said heat dissipation surface to part of the surface of said cooler outside said peripheral region.

* * * * *